United States Patent
Nishida (10) Patent No.: US 9,258,002 B2
(45) Date of Patent: Feb. 9, 2016

(54) INTERFERENCE FILTER, OPTICAL MODULE, AND ELECTRONIC APPARATUS

(71) Applicant: Seiko Epson Corporation, Tokyo (JP)

(72) Inventor: Tetsuo Nishida, Suwa (JP)

(73) Assignee: Seiko Epson Corporation (JP)

( * ) Notice: Subject to any disclaimer, the term of this patent is extended or adjusted under 35 U.S.C. 154(b) by 116 days.

(21) Appl. No.: 13/737,613

(22) Filed: Jan. 9, 2013

(65) Prior Publication Data

US 2013/0176081 A1 Jul. 11, 2013

(30) Foreign Application Priority Data

Jan. 11, 2012 (JP) ................................. 2012-003274

(51) Int. Cl.
*H03L 7/26* (2006.01)
*G04F 5/14* (2006.01)

(52) U.S. Cl.
CPC ...... *H03L 7/26* (2013.01); *G04F 5/14* (2013.01)

(58) Field of Classification Search
CPC ........................................................ H03L 7/26
USPC ........................................................ 331/3, 94.1
See application file for complete search history.

(56) References Cited

U.S. PATENT DOCUMENTS

| 7,893,780 B2* | 2/2011 | Bulatowicz et al. | 331/94.1 |
| 2009/0174489 A1* | 7/2009 | Aoyama et al. | 331/94.1 |
| 2011/0095755 A1* | 4/2011 | Maki | 324/244.1 |

FOREIGN PATENT DOCUMENTS

| JP | 04-073979 A | 3/1992 |
| JP | 2009-141048 A | 6/2009 |
| JP | 2009-232337 A | 10/2009 |

\* cited by examiner

*Primary Examiner* — Jeffrey Shin
(74) *Attorney, Agent, or Firm* — Harness, Dickey & Pierce, P.L.C.

(57) ABSTRACT

An optical module for an atomic oscillator using a quantum interference effect includes a first light source unit that emits first resonance light, a gas cell in which an alkali metal atom is sealed, a first light detection unit that detects the intensity of the first resonance light having passed through the gas cell, a determination unit that determines whether or not the first light source unit has failed, a second light source unit that irradiates the gas cell with second resonance light when the determination unit determines that the first light source unit has failed, and a second light detection unit that detects the intensity of the second resonance light having passed through the gas cell, and the optical path length of the first resonance light in the gas cell and the optical path length of the second resonance light in the gas cell are equal to each other.

20 Claims, 7 Drawing Sheets

INTERFERENCE FILTER, OPTICAL MODULE, AND ELECTRONIC APPARATUS

BACKGROUND

1. Technical Field

The present invention relates to an optical module for an atomic oscillator and an atomic oscillator.

2. Related Art

An atomic oscillator using CPT (coherent population trapping), which is a quantum interference effect, has recently been proposed and expected to reduce the size and power consumption of an apparatus. A CPT-based atomic oscillator uses a phenomenon in which when an alkali metal atom is irradiated with coherent light having two wavelengths (frequencies) different from each other, the atom stops absorbing the coherent light (EIT phenomenon: electromagnetically induced transparency).

An atomic oscillator is widely used as a high-precision oscillator, for example, in a communication base station, which has a system including a plurality of backup atomic oscillators because high reliability is required and immediately switches a failed atomic oscillator to an alternate one.

In the system in which a failed atomic oscillator is switched to an alternate one described above, however, even when only part of the members that form an atomic oscillator fails, the whole atomic oscillator needs to be exchanged, resulting in a high exchange cost.

For example, the optical module for an atomic oscillator disclosed in JP-A-2009-231688 includes a gas cell component formed of a gas cell and a heater integrated with each other and a holder that allows the gas cell component to be inserted and removed. The holder therefore allows the gas cell to be exchanged and lowers the exchange cost.

The optical module for an atomic oscillator disclosed in JP-A-2009-231688, however, is problematic because it cannot handle a situation where a light source fails.

SUMMARY

An advantage of some aspects of the invention is to provide an optical module for an atomic oscillator that allows the exchange cost to be lowered. Another advantage of some aspects of the invention is to provide an atomic oscillator including the optical module for an atomic oscillator.

An aspect of the invention is directed to an optical module for an atomic oscillator which uses a quantum interference effect. The optical module includes a first light source unit that emits first resonance light having two wavelengths different from each other, a gas cell in which an alkali metal atom is sealed, a first light detection unit that detects the intensity of the first resonance light having passed through the gas cell, a determination unit that determines whether or not the first light source unit has failed, a second light source unit that irradiates the gas cell with second resonance light having two wavelengths different from each other when the determination unit determines that the first light source unit has failed, and a second light detection unit that detects the intensity of the second resonance light having passed through the gas cell. The optical path length of the first resonance light in the gas cell and the optical path length of the second resonance light in the gas cell are equal to each other.

According to the optical module for an atomic oscillator described above, when it is determined that the first light source unit has failed, the second light source unit can irradiate the gas cell with resonance light. Therefore, when the first light source unit fails, the exchange cost can be reduced because it is not necessary to exchange the entire optical module.

In the optical module for an atomic oscillator according to the aspect of the invention, the gas cell may have a polyhedral shape having an even number of surfaces but at least six surfaces.

According to the optical module for an atomic oscillator described above, when the first light source unit fails, the exchange cost can be reduced because it is not necessary to exchange the entire optical module.

In the optical module for an atomic oscillator according to the aspect of the invention, the gas cell may have a first surface, a second surface facing the first surface, a third surface, and a fourth surface facing the third surface. The distance between the first surface and the second surface and the distance between the third surface and the fourth surface may be equal to each other. The first resonance light may be incident on the first surface, and the first light detection unit may detect the first resonance light having exited through the second surface. The second resonance light may be incident on the third surface, and the second light detection unit may detect the second resonance light having exited through the fourth surface.

According to the optical module for an atomic oscillator described above, the optical path length of the first resonance light in the gas cell and the optical path length of the second resonance light in the gas cell can be readily set at the same value.

In the optical module for an atomic oscillator according to the aspect of the invention, the first resonance light may be incident on the first surface at right angles, and the second resonance light may be incident on the third surface at right angles.

According to the optical module for an atomic oscillator described above, for example, when an antireflection film is provided on the gas cell, the antireflection film can be readily designed.

In the optical module for an atomic oscillator according to the aspect of the invention, the gas cell may have a box-like shape, and the first resonance light and the second resonance light that are incident on the gas cell may pass through the center of the gas cell.

According to the optical module for an atomic oscillator described above, the degree of an adverse effect produced when the alkali metal atoms impinge on wall surfaces of the gas cell can be lowered.

In the optical module for an atomic oscillator according to the aspect of the invention, the gas cell may have a cylindrical shape.

According to the optical module for an atomic oscillator described above, for example, the degree of freedom in arranging the first light source unit, the first light detection unit, the second light source unit, and the second light detection unit is higher than that in a case where the gas cell has a box-like shape.

In the optical module for an atomic oscillator according to the aspect of the invention, the first resonance light and the second resonance light may be incident on a cylindrical surface of the gas cell.

According to the optical module for an atomic oscillator described above, the optical path length of the first resonance light in the gas cell and the optical path length of the second resonance light in the gas cell can be readily set at the same value.

In the optical module for an atomic oscillator according to the aspect of the invention, the first resonance light and the second resonance light that are incident on the gas cell may intersect the central axis of the cylindrical shape of the gas cell at right angles.

According to the optical module for an atomic oscillator described above, the degree of an adverse effect produced when the alkali metal atoms impinge on wall surfaces of the gas cell can be lowered.

In the optical module for an atomic oscillator according to the aspect of the invention, the gas cell may have a spherical shape.

According to the optical module for an atomic oscillator described above, for example, the degree of freedom in arranging the first light source unit, the first light detection unit, the second light source unit, and the second light detection unit is higher than that in a case where the gas cell has a box-like shape.

In the optical module for an atomic oscillator according to the aspect of the invention, the first resonance light and the second resonance light that are incident on the gas cell may pass through the center of the gas cell.

According to the optical module for an atomic oscillator described above, the degree of an adverse effect produced when the alkali metal atoms impinge on wall surfaces of the gas cell can be lowered.

In the optical module for an atomic oscillator according to the aspect of the invention, the determination unit may determine whether or not the first light source unit has failed based on the intensity of the first resonance light detected by the first light detection unit.

According to the optical module for an atomic oscillator described above, a failure can be detected in a simple configuration with no additional component for detecting a failure.

Another aspect of the invention is directed to an atomic oscillator including the optical module for an atomic oscillator according to the aspect of the invention. According to the atomic oscillator described above, which includes the optical module for an atomic oscillator according to the aspect of the invention, the exchange cost can be lowered.

BRIEF DESCRIPTION OF THE DRAWINGS

The invention will be described with reference to the accompanying drawings, wherein like numbers reference like elements.

DESCRIPTION OF EXEMPLARY EMBODIMENTS

Preferred embodiments of the invention will be described below in detail with reference to the drawings. Embodiments that will be described below are not intended to unduly limit the contents of the invention set forth in the appended claims, and all the components described below are not necessarily essential to the invention.

1. First Embodiment

Figure 1:
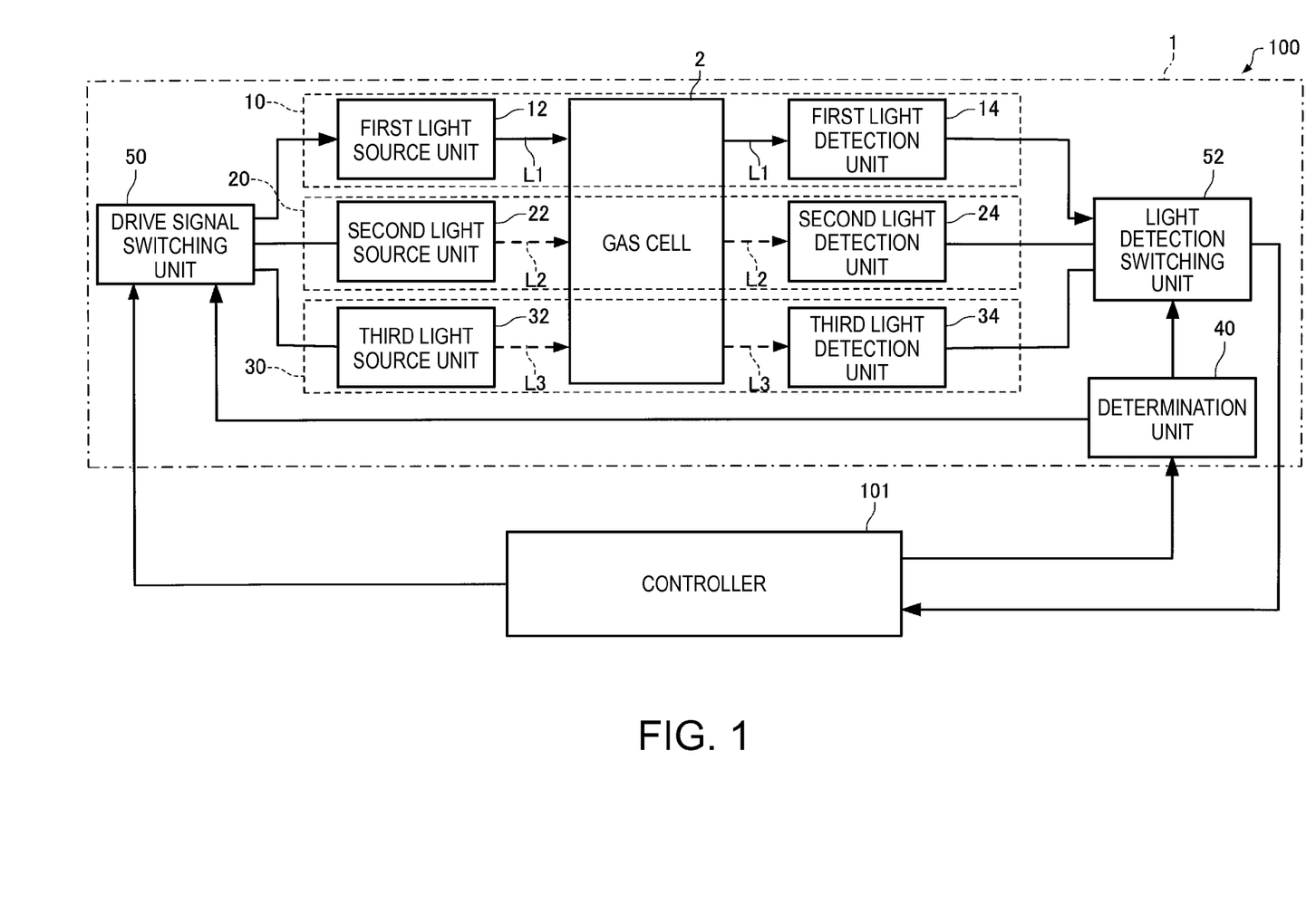
FIG. 1 is a functional block diagram of an atomic oscillator according to a first embodiment.

Anatomic oscillator according to a first embodiment will first be described with reference to the drawings. FIG. 1 is a functional block diagram of an atomic oscillator 100 according to the first embodiment.

The atomic oscillator 100 is an oscillator using a quantum interference effect (EIT phenomenon). The atomic oscillator 100 includes an optical module 1 and a controller 101.

The optical module 1 includes a first optical system 10, a second optical system 20, a third optical system 30, a determination unit 40, a drive signal switching unit 50, and a light detection switching unit 52.

In the optical module 1, when the determination unit 40 determines that a first light source unit 12 in the first optical system 10 has failed, a second light source unit 22 in the second optical system 20 irradiates a gas cell 2 with second resonance light L2, and a second light detection unit 24 detects the second resonance light L2 having passed through the gas cell 2. Further, when the determination unit 40 determines that the second light source unit 22 has failed, a third light source unit 32 in the third optical system 30 irradiates the gas cell 2 with third resonance light L3, and a third light detection unit 34 detects the third resonance light L3 having passed through the gas cell 2. FIG. 1 shows a state in which the first optical system 10 is used (a state in which the first light source unit 12 emits first resonance light L1).

The first optical system 10 includes the first light source unit 12, the gas cell 2, and a first light detection unit 14. The first light source unit 12 emits first resonance light L1 having two wavelengths different from each other. The first resonance light L1 produced in the first light source unit 12 contains a first sideband wave W1 having a frequency $f_1=f_0+f_m$ in an upper side band with respect to a center frequency $f_0$ and a second sideband wave W2 having a frequency $f_2=f_0-f_m$ in a lower side band with respect to the center frequency $f_0$ (see FIGS. 2A and 2B).

The gas cell 2 is a container in which a gaseous alkali metal atom (such as sodium (Na) atom, rubidium (Rb) atom, and cesium (Cs) atom) is sealed. The gas cell 2 is a member common to the first optical system 10, the second optical system 20, and the third optical system 30.

The first light detection unit 14 detects the intensity of the first resonance light L1 having passed through the gas cell 2.

The second optical system 20 includes the second light source unit 22, the gas cell 2, and the second light detection unit 24.

When the determination unit 40 determines that the first light source unit 12 has failed, the second light source unit 22 irradiates the gas cell 2 with the second resonance light L2 having two wavelengths different from each other. The second resonance light L2 produced in the second light source unit 22 contains the first sideband wave W1 having the frequency $f_1=f_0+f_m$ and the second sideband wave W2 having the frequency $f_2=f_0-f_m$, as the first resonance light L1 does. The optical path length of the second resonance light L2 in the gas cell 2 is equal to the optical path length of the first resonance light L1 in the gas cell 2. The optical path length in the gas cell 2 is the distance along the optical axis over which each resonance light travels in the gas cell 2.

The second light detection unit 24 detects the intensity of the second resonance light L2 having passed through the gas cell 2.

The third optical system 30 includes the third light source unit 32, the gas cell 2, and the third light detection unit 34.

When the determination unit 40 determines that the second light source unit 22 has failed, the third light source unit 32 irradiates the gas cell 2 with the third resonance light L3 having two wavelengths different from each other. The third resonance light L3 produced in the third light source unit 32 contains the first sideband wave W1 having the frequency $f_1 = f_0 + f_m$ and the second sideband wave W2 having the frequency $f_2 = f_0 - f_m$, as the first resonance light L1 and the second resonance light L2 do. The optical path length of the first resonance light L1 in the gas cell 2, the optical path length of the second resonance light L2 in the gas cell 2, and the optical path length of the third resonance light L3 in the gas cell 2 are equal to each other.

The third light detection unit 34 detects the intensity of the third resonance light L3 having passed through the gas cell 2.

The determination unit 40 determines whether or not the first light source unit 12 has failed based on the intensity of the first resonance light L1 detected by the first light detection unit 14. Further, the determination unit 40 determines whether or not the second light source unit 22 has failed based on the intensity of the second resonance light L2 detected by the second light detection unit 24.

For example, when the intensity of the first resonance light L1 is lower than a predetermined threshold, the determination unit 40 determines that the first light source unit 12 has failed. On the other hand, when the intensity of the first resonance light L1 is higher than or equal to the predetermined threshold, the determination unit 40 determines that the first light source unit 12 has not failed. When the determination unit 40 determines that the first light source unit 12 has not failed, the determination unit 40 keeps carrying out the determination process based on the intensity of the first resonance light L1 detected by the first light detection unit 14.

Further, for example, when the intensity of the second resonance light L2 is lower than the predetermined threshold, the determination unit 40 determines that the second light source unit 22 has failed. On the other hand, when the intensity of the second resonance light L2 is higher than or equal to the predetermined threshold, the determination unit 40 determines that the second light source unit 22 has not failed. When the determination unit 40 determines that the second light source unit 22 has not failed, the determination unit 40 keeps carrying out the determination process based on the intensity of the second resonance light L2 detected by the second light detection unit 24.

As described above, the determination of whether or not any of the light source units has failed is a determination of whether or not the light source unit emits resonance light of at least a predetermined intensity. In other words, a light source unit unable to emit resonance light of at least the predetermined intensity anymore is determined to be defective. In the example described above, each of the detection units detects the intensity of the corresponding resonance light having passed through the gas cell 2 for determination. Alternatively, a light detector provided separately from the detection units may be used to detect each resonance light for the determination before the resonance light is incident on the gas cell 2. Further, a method other than the method for detecting the intensity of resonance light may be used to determine whether or not a light source unit has failed as long as the alternative method can sense an abnormal event with the light source unit. For example, whether or not a light source unit has failed can be determined by sensing an abnormal current or voltage value applied to the light source unit.

The drive signal switching unit 50 selectively connects one of the light source units 12, 22, and 32 to the controller 101 based on the determination result from the determination unit 40. Specifically, the drive signal switching unit 50 keeps connecting the first light source unit 12 to the controller 101 as shown in FIG. 1 until the determination unit 40 determines that the first light source unit 12 has failed. An output signal (drive signal) from the controller 101 is thus inputted to the first light source unit 12. Thereafter, when the determination unit 40 determines that the first light source unit 12 has failed, the drive signal switching unit 50 switches the connection to the first light source unit 12 to the connection to the second light source unit 22 or connects the second light source unit 22 to the controller 101. The drive signal is therefore inputted to the second light source unit 22. Thereafter, when the determination unit 40 determines that the second light source unit 22 has failed, the drive signal switching unit 50 switches the connection to the second light source unit 22 to the connection to the third light source unit 32 or connects the third light source unit 32 to the controller 101. The drive signal is therefore inputted to the third light source unit 32.

The light detection switching unit 52 selectively connects one of the light detection units 14, 24, and 34 to the controller 101 based on the determination result from the determination unit 40. Specifically, the light detection switching unit 52 keeps connecting the first light detection unit 14 to the controller 101 as shown in FIG. 1 until the determination unit 40 determines that the first light source unit 12 has failed. An output signal from the first light detection unit 14 is thus inputted to the controller 101. Thereafter, when the determination unit 40 determines that the first light source unit 12 has failed, the light detection switching unit 52 switches the connection to the first light detection unit 14 to the connection to the second light detection unit 24 or connects the second light detection unit 24 to the controller 101. An output signal from the second light detection unit 24 is therefore inputted to the controller 101. Thereafter, when the determination unit 40 determines that the second light source unit 22 has failed, the light detection switching unit 52 switches the connection to the second light detection unit 24 to the connection to the third light detection unit 34 or connects the third light detection unit 34 to the controller 101. An output signal from the third light detection unit 34 is therefore inputted to the controller 101.

The controller 101 performs control based on the detection result from one of the light detection units 14, 24, and 34 in such a way that the difference in wavelength (frequency) between the first sideband wave W1 and the second sideband wave W2 is equal to the frequency corresponding to the difference in energy between two base levels of the alkali metal atom sealed in the gas cell 2. The controller 101 produces a drive signal containing a modulation frequency $f_m$ based on the detection result from one of the light detection units 14, 24, and 34. The drive signal is inputted to the corresponding one of the light source units 12, 22, and 32 via the drive signal switching unit 50. A specific procedure is as follows.

When the light detection switching unit 52 connects the first light detection unit 14 to the controller 101, the controller 101 produces a drive signal containing the modulation frequency $f_m$ based on the detection result from the first light detection unit 14. The drive signal is then inputted to the first light source unit 12 via the drive signal switching unit 50. The first light source unit 12 modulates a fundamental wave F having the predetermined frequency $f_0$ based on the drive signal to produce the first sideband wave W1 having the frequency $f_1=f_0+f_m$ and the second sideband wave W2 having the frequency $f_2=f_0-f_m$. Further, when the light detection switching unit 52 connects the second light detection unit 24 to the controller 101, the controller 101 produces a drive signal containing the modulation frequency $f_m$ based on the detection result from the second light detection unit 24. The drive signal is then inputted to the second light source unit 22 via the drive signal switching unit 50. The second light source unit 22 modulates the fundamental wave F having the predetermined frequency $f_0$ based on the drive signal to produce the first sideband wave W1 having the frequency $f_1$ and the second sideband wave W2 having the frequency $f_2$.

Further, when the light detection switching unit 52 connects the third light detection unit 34 to the controller 101, the controller 101 produces a drive signal containing the modulation frequency $f_m$ based on the detection result from the third light detection unit 34. The drive signal is then inputted to the third light source unit 32 via the drive signal switching unit 50. The third light source unit 32 modulates the fundamental wave F having the predetermined frequency $f_0$ based on the drive signal to produce the first sideband wave W1 having the frequency $f_1$ and the second sideband wave W2 having the frequency $f_2$.

Figure 2A:
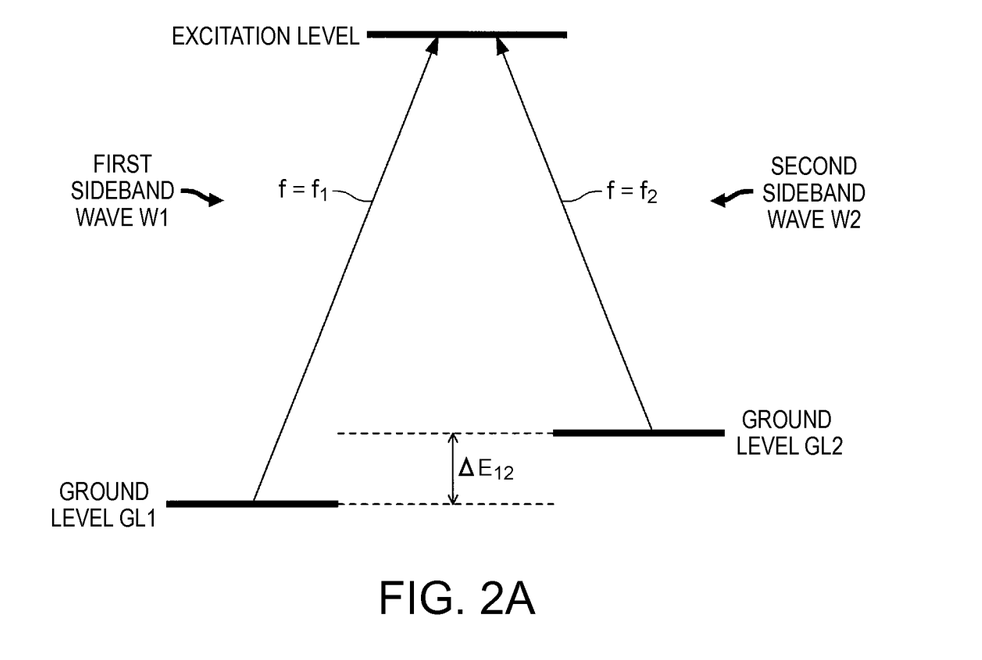
FIG. 2A shows a Λ-type three-level model of an alkali metal atom and the relationship between the Λ-type three-level model, a first sideband wave, and a second sideband wave.
Figure 2B:
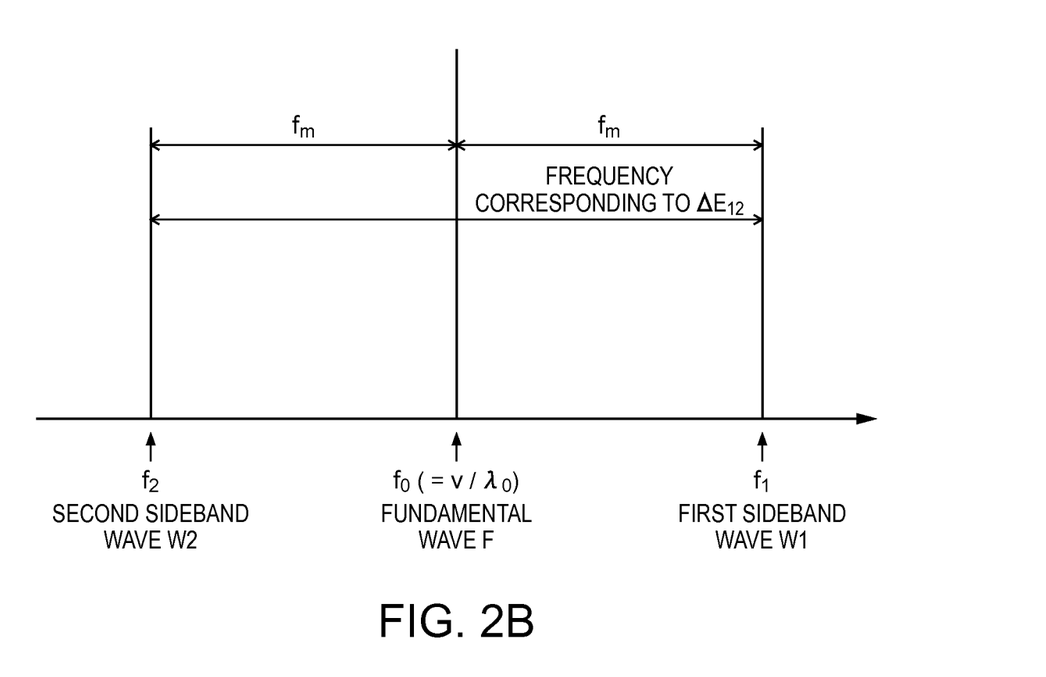
FIG. 2B shows a frequency spectrum of resonance light produced in a light source unit.

FIG. 2A shows a Λ-type three-level model of an alkali metal atom and the relationship between the Λ-type three-level model, the first sideband wave W1, and the second sideband wave W2. FIG. 2B shows a frequency spectrum of resonance light.

Each of the resonance light beams L1, L2, and L3 produced in the light source units 12, 22, and 32 contains the following components shown in FIG. 2B: the fundamental wave F having the center frequency $f_0$ ($=v/\lambda_0$: v represents the speed of light and $\lambda_0$ represents the center wavelength of the laser light); the first sideband wave W1 having the frequency $f_1$ in the upper side band with respect to the center frequency $f_0$; and the second sideband wave W2 having the frequency $f_2$ in the lower side band with respect to the center frequency $f_0$. The frequency $f_1$ of the first sideband wave W1 is $f_1=f_0+f_m$, and the frequency $f_2$ of the second sideband wave W2 is $f_2=f_0-f_m$.

The difference between the frequency $f_1$ of the first sideband wave W1 and the frequency $f_2$ of the second sideband wave W2 agrees with the frequency corresponding to the difference in energy $\Delta E_{12}$ between a ground level GL1 and a ground level GL2 of the alkali metal atom, as shown in FIGS. 2A and 2B. The alkali metal atom therefore experiences an EIT phenomenon resulting from the first sideband wave W1 having the frequency $f_1$ and the second sideband wave W2 having the frequency $f_2$. The EIT phenomenon will now be described. It is known that the Λ-type three-level model can explain the interaction between an alkali metal atom and light. When the alkali metal atom has two ground levels and is irradiated separately with the first sideband wave W1 having a wavelength (frequency $f_1$) corresponding to the difference in energy between the ground level GL1 and the excitation level or the second sideband wave W2 having a wavelength (frequency $f_2$) corresponding to the difference in energy between the ground level GL2 and the excitation level, light absorption occurs, as shown in FIG. 2A. On the other hand, when the alkali metal atom is irradiated at the same time with the first sideband wave W1 and the second sideband wave W2, the frequency difference $f_1-f_2$ between which exactly agrees with the frequency corresponding to the energy difference $\Delta E_{12}$ between the ground level GL1 and the ground level GL2, the two ground levels are superimposed, that is, quantum interference occurs as shown in FIG. 2B, resulting in a transparency phenomenon (EIT phenomenon) in which excitation to the excitation level does not occur and the first sideband wave W1 and the second sideband wave W2 pass through the alkali metal atom. A high-precision oscillator can be formed by using the EIT phenomenon, that is, by detecting and controlling a steep change in the light absorption behavior that occurs when the frequency difference $f_1-f_2$ between the first sideband wave W1 and the second sideband wave W2 deviates from the frequency corresponding to the energy difference $\Delta E_{12}$ between the ground level GL1 and the ground level GL2.

Figure 3:
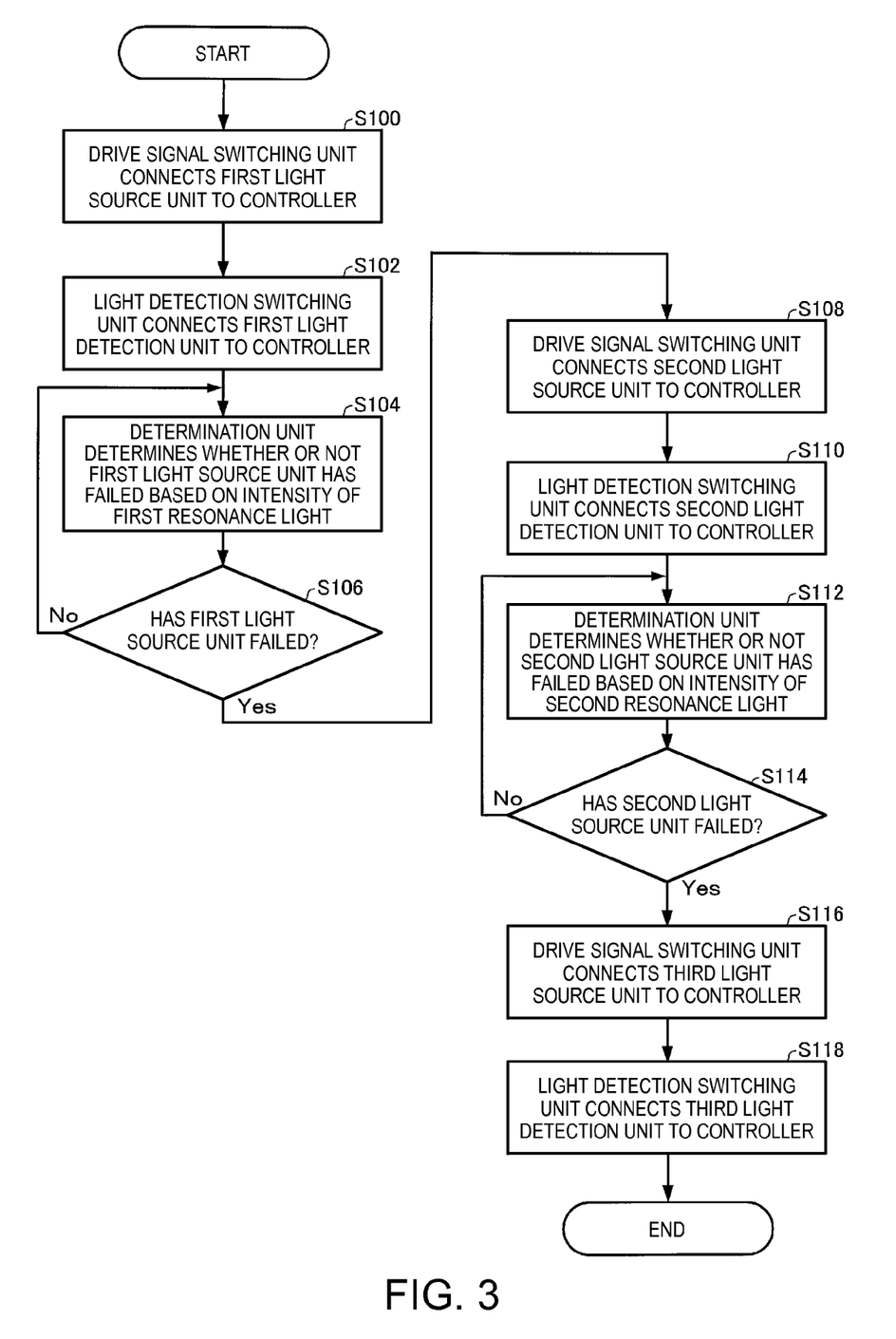
FIG. 3 shows an example of a flowchart including processes carried out by the atomic oscillator according to the first embodiment.

FIG. 3 shows an example of a flowchart including processes carried out by the atomic oscillator 100 according to the present embodiment.

The drive signal switching unit 50 connects the first light source unit 12 to the controller 101 (S100). The drive signal is thus supplied to the first light source unit 12. The first light source unit 12 receives the drive signal and emits the first resonance light L1. The first resonance light L1 passes through the gas cell 2 and enters the first light detection unit 14. The first light detection unit 14 detects the intensity of the first resonance light L1.

The light detection switching unit 52 connects the first light detection unit 14 to the controller 101 (S102). The controller 101 produces a drive signal containing the modulation frequency $f_m$ based on the detection result from the first light detection unit 14. The drive signal is inputted to the first light source unit 12 via the drive signal switching unit 50.

Alternatively, after the light detection switching unit 52 first connects the first light detection unit 14 to the controller 101, the drive signal switching unit 50 may connect the first light source unit 12 to the controller 101.

The determination unit 40 determines whether or not the first light source unit 12 has failed based on the intensity of the first resonance light L1 (S104). The determination unit 40 repeatedly carries out the determination process in step S104 until it is determined that the first light source unit 12 has failed (until the determination result in step S106 becomes Yes).

When the determination unit 40 determines that the first light source unit 12 has failed (Yes in S106), the drive signal switching unit 50 switches the connection to the first light source unit 12 to the connection to the second light source unit 22 or connects the second light source unit 22 to the controller 101 (S108). The drive signal is thus inputted to the second light source unit 22 via the drive signal switching unit 50.

The second light source unit 22 receives the drive signal and emits the second resonance light L2. The second resonance light L2 passes through the gas cell 2 and enters the second light detection unit 24. The second light detection unit 24 detects the second resonance light L2.

When the determination unit 40 determines that the first light source unit 12 has failed (Yes in S106), the light detection switching unit 52 switches the connection to the first light detection unit 14 to the connection to the second light detection unit 24 or connects the second light detection unit 24 to the controller 101 (S110). The controller 101 produces a drive signal containing the modulation frequency $f_m$ based on the detection result from the second light detection unit 24. The drive signal is inputted to the second light source unit 22 via the drive signal switching unit 50.

The determination unit 40 determines whether or not the second light source unit 22 has failed based on the intensity of the second resonance light L2 (S112). The determination unit 40 repeatedly carries out the determination process in step S112 until it is determined that the second light source unit 22 has failed (until the determination result in step S114 becomes Yes).

When the determination unit 40 determines that the second light source unit 22 has failed (Yes in S114), the drive signal switching unit 50 switches the connection to the second light source unit 22 to the connection to the third light source unit 32 or connects the third light source unit 32 to the controller 101 (S116).

The third light source unit 32 receives the drive signal and emits the third resonance light L3. The third resonance light L3 passes through the gas cell 2 and enters the third light detection unit 34. The third light detection unit 34 detects the third resonance light L3.

When the determination unit 40 determines that the second light source unit 22 has failed (Yes in S114), the light detection switching unit 52 switches the connection to the second light detection unit 24 to the connection to the third light detection unit 34 or connects the third light detection unit 34 to the controller 101 (S118). The controller 101 produces a drive signal containing the modulation frequency $f_m$ based on the detection result from the third light detection unit 34. The drive signal is inputted to the third light source unit 32 via the drive signal switching unit 50.

For example, when a signal that instructs the controller 101 to stop carrying out the processes is inputted, the atomic oscillator 101 stops carrying out the processes.

Figure 4:
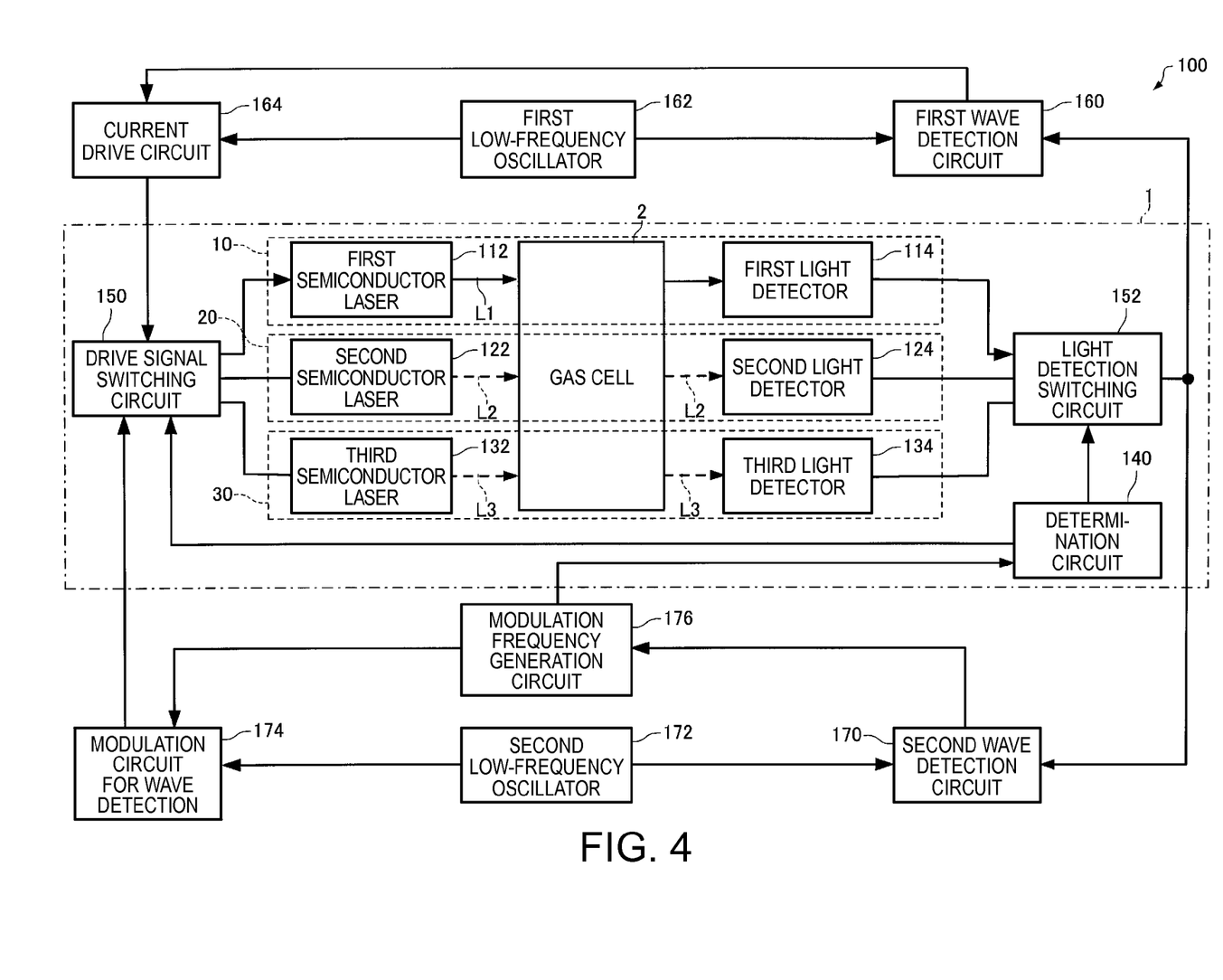
FIG. 4 shows the configuration of the atomic oscillator according to the first embodiment.

A description will next be made of a more specific configuration of the atomic oscillator 100 according to the first embodiment. FIG. 4 shows the configuration of the atomic oscillator 100 according to the first embodiment. FIG. 4 shows a state in which the first optical system 10 is used.

The atomic oscillator 100 includes a first semiconductor laser 112, the gas cell 2, a first light detector 114, a second semiconductor laser 122, a second light detector 124, a third semiconductor laser 132, a third light detector 134, a determination circuit 140, a drive signal switching circuit 150, a light detection switching circuit 152, a first wave detection circuit 160, a first low-frequency oscillator 162, a current drive circuit 164, a second wave detection circuit 170, a second low-frequency oscillator 172, a modulation circuit for wave detection 174, and a modulation frequency generation circuit 176, as shown in FIG. 4.

Each of the semiconductor lasers 112, 122, and 132 is, for example, a vertical cavity surface emitting laser (VCSEL). Light produced in a vertical cavity surface emitting laser, which is coherent light, is preferably used to produce a quantum interference effect. Each of the semiconductor lasers 112, 122, and 132 may alternatively be an edge emitting laser. The first semiconductor laser 112 is capable of emitting the first resonance light L1. The laser light emitted from the first semiconductor laser 112 has the center frequency $f_0$ (center wavelength $\lambda_0$), which is controlled by a drive current outputted from the current drive circuit 164, and is modulated by an output signal (modulation signal) from the modulation frequency generation circuit 176. That is, the laser light emitted from the first semiconductor laser 112 can be modulated by superimposing an AC current having the frequency component of the modulation signal on the drive current from the current drive circuit 164. The first semiconductor laser 112 can thus emit the first resonance light L1 containing the first sideband wave W1 and the second sideband wave W2.

The second semiconductor laser 122 is capable of emitting the second resonance light L2. The laser light emitted from the second semiconductor laser 122 can be modulated by superimposing the AC current having the frequency component of the modulation signal on the drive current from the current drive circuit 164, as in the case of the first semiconductor laser 112 described above. The second semiconductor laser 122 can thus emit the second resonance light L2 containing the first sideband wave W1 and the second sideband wave W2.

The third semiconductor laser 132 is capable of emitting the third resonance light L3. The laser light emitted from the third semiconductor laser 132 can be modulated by superimposing the AC current having the frequency component of the modulation signal on the drive current from the current drive circuit 164, as in the cases of the semiconductor lasers 112 and 122 described above. The third semiconductor laser 132 can thus emit the third resonance light L3 containing the first sideband wave W1 and the second sideband wave W2.

The gas cell 2 is a container in which a gaseous alkali metal atom (such as sodium (Na) atom, rubidium (Rb) atom, and cesium (Cs) atom) is sealed. When the gas cell 2 is irradiated with two light waves having a frequency (wavelength) difference corresponding to the difference in energy between the two ground levels of the alkali metal atom, the alkali metal atom experiences an EIT phenomenon. For example, when the alkali metal atom is a cesium atom, the frequency corresponding to the difference in energy between a ground level GL1 and a ground level GL2 at the DI line is 9.19263 . . . GHz. In this case, the gas cell 2 experiences an EIT phenomenon when irradiated with two light waves having a frequency difference of 9.19263 . . . GHz.

Each of the first light detector 114, the second light detector 124, and the third light detector 134 is, for example, a photodiode.

The first light detector 114 detects the first resonance light L1 having passed through the gas cell 2 and outputs a signal having a signal intensity according to the amount of detected light.

The second light detector 124 detects the second resonance light L2 having passed through the gas cell 2 and outputs a signal having a signal intensity according to the amount of detected light.

The third light detector 134 detects the third resonance light L3 having passed through the gas cell 2 and outputs a signal having a signal intensity according to the amount of detected light.

The light detection switching circuit 152 changes the connection between the light detectors 114, 124, 134 and the wave detection circuits 160, 170 based on the determination result from the determination circuit 140. Specifically, the light detection switching circuit 152 keeps connecting the first light detector 114 to the wave detection circuits 160 and 170 until the determination circuit 140 determines that the first semiconductor laser 112 has failed. An output signal from the first light detector 114 is thus inputted to the wave detection circuits 160 and 170. Thereafter, when the determination circuit 140 determines that the first semiconductor laser 112 has failed, the light detection switching circuit 152 changes the connection in such a way that the second light detector 124 is connected to the wave detection circuits 160 and 170. An output signal from the second light detector 124 is thus inputted to the wave detection circuits 160 and 170. Thereafter, when the determination circuit 140 determines that the second semiconductor laser 122 has failed, the light detection switching circuit 152 changes the connection in such a way that the third light detector 134 is connected to the wave detection circuits 160 and 170. The output signal from the third light detector 134 is thus inputted to the wave detection circuits 160 and 170.

The first wave detection circuit 160 uses an oscillation signal from the first low-frequency oscillator 162, which oscillates at a low frequency ranging from about several hertz to several hundreds of hertz, to perform synchronous wave detection of the output signal outputted from one of the light detectors 114, 124, and 134 (first light detector 114 in the example shown in FIG. 4) and inputted via the light detection switching circuit 152.

The current drive circuit 164 produces a drive current having a magnitude according to the output signal from the first wave detection circuit 160 to control the center frequency $f_0$ (center wavelength $\lambda_0$) of the laser light. To allow the first wave detection circuit 160 to perform the synchronous detection, the oscillation signal from the first low-frequency oscillator 162 (the same as the oscillation signal supplied to the first wave detection circuit 160) is superimposed on the drive current produced by the current drive circuit 164.

The drive signal switching circuit 150 changes the connection between the semiconductor lasers 112, 122, 132 and the peripheral circuits, that is, the current drive circuit 164 and the modulation circuit for wave detection 174 based on the determination result from the determination circuit 140. Specifically, the drive signal switching circuit 150 keeps connecting the first semiconductor laser 112 to the current drive circuit 164 and the modulation circuit for wave detection 174 until the determination circuit 140 determines that the first semiconductor laser 112 has failed. Output signals from the current drive circuit 164 and the modulation circuit for wave detection 174 are thus inputted to the first semiconductor laser 112. Thereafter, when the determination circuit 140 determines that the first semiconductor laser 112 has failed, the drive signal switching circuit 150 changes the connection in such a way that the second semiconductor laser 122 is connected to the current drive circuit 164 and the modulation circuit for wave detection 174. As a result, the output signals from the current drive circuit 164 and the modulation circuit for wave detection 174 are inputted to the second semiconductor laser 122. Thereafter, when the determination circuit 140 determines that the second semiconductor laser 122 has failed, the drive signal switching circuit 150 changes the connection in such a way that the third semiconductor laser 132 is connected to the current drive circuit 164 and the modulation circuit for wave detection 174. As a result, the output signals from the current drive circuit 164 and the modulation circuit for wave detection 174 are inputted to the third semiconductor laser 132.

In the example shown in FIG. 4, a feedback loop formed, in the following order, of the first semiconductor laser 112, the gas cell 2, the first light detector 114, the light detection switching circuit 152, the first wave detection circuit 160, the current drive circuit 164, and the drive signal switching circuit 150 allows the center frequency $f_0$ (center wavelength $\lambda_0$) of the laser light to undergo fine adjustment until the center frequency $f_0$ is stabilized. When the determination circuit 140 determines that the first semiconductor laser 112 has failed, a feedback loop formed, in the following order, of the second semiconductor laser 122, the gas cell 2, the second light detector 124, the light detection switching circuit 152, the first wave detection circuit 160, the current drive circuit 164, and the drive signal switching circuit 150 allows the center frequency $f_0$ (center wavelength $\lambda_0$) of the laser light to undergo fine adjustment until the center frequency $f_0$ is stabilized. When the determination circuit 140 determines that the second semiconductor laser 122 has failed, a feedback loop formed, in the following order, of the third semiconductor laser 132, the gas cell 2, the third light detector 134, the light detection switching circuit 152, the first wave detection circuit 160, the current drive circuit 164, and the drive signal switching circuit 150 allows the center frequency $f_0$ (center wavelength $\lambda_0$) of the laser light to undergo fine adjustment until the center frequency $f_0$ is stabilized.

The second wave detection circuit 170 uses an oscillation signal from the second low-frequency oscillator 172, which oscillates at a low frequency ranging from about several hertz to several hundreds of hertz, to perform synchronous wave detection of the output signal outputted from one of the light detectors 114, 124, and 134 (first light detector 114 in the example shown in FIG. 4) and inputted via the light detection switching circuit 152.

The modulation frequency generation circuit 176 produces a modulation signal having the modulation frequency $f_m$ according to the voltage of the output signal from the second wave detection circuit 170.

The modulation circuit for wave detection 174 modulates the modulation signal by using the oscillation signal from the second low-frequency oscillator 172 (the same as the oscillation signal supplied to the second wave detection circuit 170), and the resultant modulation signal is supplied to one of the semiconductor lasers 112, 122, and 132 that is connected to the modulation circuit for wave detection 174. As a result, the second wave detection circuit 170 performs the synchronous wave detection with the modulation frequency $f_m$ slightly swept, and the modulation frequency $f_m$ undergoes fine adjustment in such a way that the output signal from one of the light detectors 114, 124, and 134 that is connected to the second wave detection circuit 170 is maximized.

In the example shown in FIG. 4, when the difference in frequency between the first sideband wave W1 and the second sideband wave W2 of the resonance light L1 produced in the first semiconductor laser 112 does not exactly agree with the frequency corresponding to the difference in energy between the two ground levels of the alkali metal atom contained in the gas cell 2, the alkali metal atom experiences no EIT phenomenon. In this case, the amount of light detected by the first light detector 114 changes in a very sensitive manner in accordance with the frequencies of the first sideband wave W1 and the second sideband wave W2. As a result, the feedback loop formed, in the following order, of the first semiconductor laser 112, the gas cell 2, the first light detector 114, the light detection switching circuit 152, the second wave detection circuit 170, the modulation frequency generation circuit 176, the modulation circuit for wave detection 174, and the drive signal switching circuit 150 performs feedback control in such a way that the difference in frequency between the first sideband wave W1 and the second sideband wave W2 exactly agrees with the frequency corresponding to the difference in energy between the two ground levels of the alkali metal atom. As a result, the modulation frequency is extremely stabilized, whereby the modulation signal can be used as the output signal (clock output) from the atomic oscillator 100.

Further, when the second optical system 20 is used, the feedback loop formed, in the following order, of the second semiconductor laser 122, the gas cell 2, the second light detector 124, the light detection switching circuit 152, the second wave detection circuit 170, the modulation frequency generation circuit 176, the modulation circuit for wave detection 174, and the drive signal switching circuit 150 performs feedback control in such a way that the difference in frequency between the first sideband wave W1 and the second sideband wave W2 exactly agrees with the frequency corresponding to the difference in energy between the two ground levels of the alkali metal atom.

Further, when the third optical system 30 is used, the feedback loop formed, in the following order, of the third semiconductor laser 132, the gas cell 2, the third light detector 134, the light detection switching circuit 152, the second wave detection circuit 170, the modulation frequency generation circuit 176, the modulation circuit for wave detection 174, and the drive signal switching circuit 150 performs feedback control in such a way that the difference in frequency between the first sideband wave W1 and the second sideband wave W2 exactly agrees with the frequency corresponding to the difference in energy between the two ground levels of the alkali metal atom.

The determination circuit 140 determines whether or not the semiconductor laser 112 or 122 has failed based on the output signal (modulation frequency $f_m$) from the modulation frequency generation circuit 176. In the example shown in FIG. 4, the determination circuit 140 determines that the first semiconductor laser 112 has failed when the modulation frequency $f_m$ produced by the modulation frequency generation circuit 176 does not fall within a predetermined range. The predetermined range is, for example, a range over which the modulation frequency $f_m$ varies when the feedback control described above is satisfactorily performed. That is, it can be said that the case where the modulation frequency $f_m$ does not fall within the predetermined range is a case where the feedback control described above does not work. When the first semiconductor laser 112 has failed and the intensity of the first resonance light L1 has decreased or no first resonance light L1 has been emitted, the modulation frequency $f_m$ cannot be controlled by the feedback control described above or does not fall within the predetermined range. The determination circuit 140 can therefore determine whether or not the first semiconductor laser 112 has failed based on the output signal (modulation frequency $f_m$) from the modulation frequency generation circuit 176. The determination circuit 140 determines whether or not the second semiconductor laser 122 has failed by carrying out the same processes as in the case of the first semiconductor laser 112.

When the determination circuit 140 determines that the semiconductor laser 112 or 122 has failed, the determination circuit 140 outputs a determination signal. The determination signal is inputted to the drive signal switching circuit 150 and the light detection switching circuit 152.

The method for determining whether or not any of the semiconductor lasers has failed is not limited to the method described above.

The semiconductor lasers 112, 122, and 132, the light detectors 114, 124, and 134, the drive signal switching circuit 150, the light detection switching circuit 152, and the determination circuit 140 correspond to the light source units 12, 22, and 32, the light detection units 14, 24, and 34, the drive signal switching unit 50, the light detection switching unit 52, and the determination unit 40 shown in FIG. 1, respectively. Further, the circuit formed of the first wave detection circuit 160, the first low-frequency oscillator 162, the current drive circuit 164, the second wave detection circuit 170, the second low-frequency oscillator 172, the modulation circuit for wave detection 174, and the modulation frequency generation circuit 176 corresponds to the controller 101 shown in FIG. 1.

Figure 5:
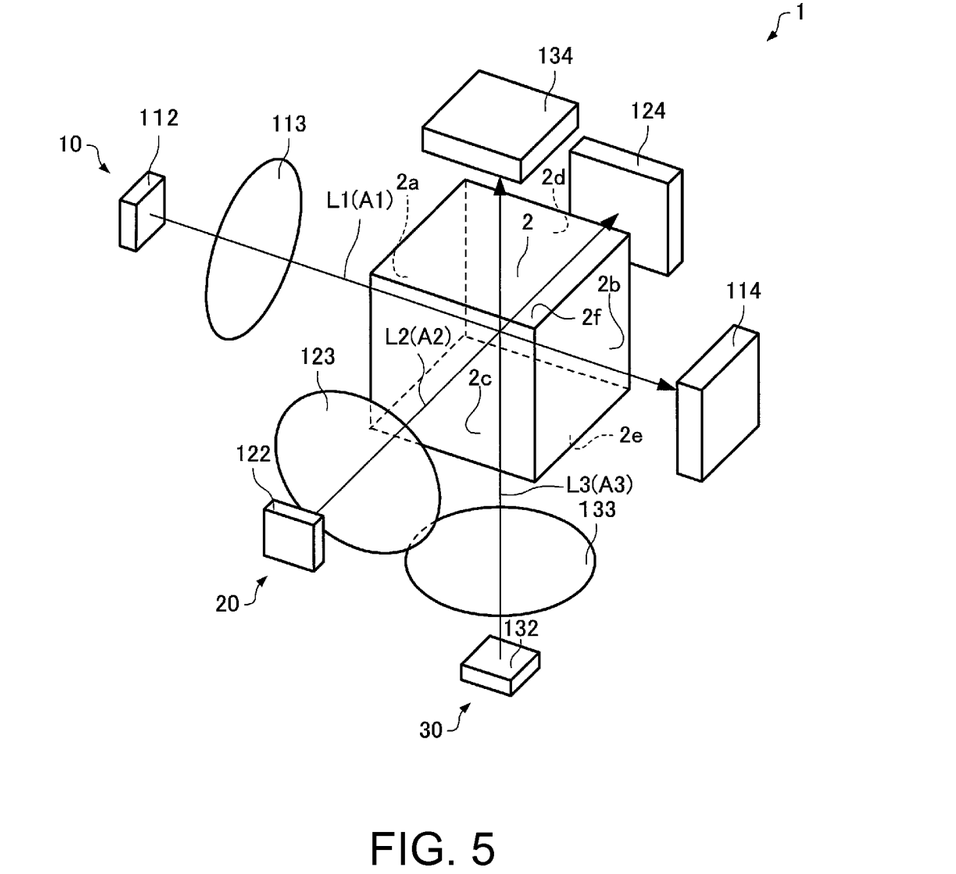
FIG. 5 is a perspective view diagrammatically showing an optical module for an atomic oscillator according to the first embodiment.

FIG. 5 is a perspective view diagrammatically showing the optical module 1. In FIG. 5, the determination circuit 140, the drive signal switching circuit 150, and the light detection switching circuit 152 are not shown for convenience.

The first semiconductor laser 112, a collimation lens 113, the gas cell 2, and the first light detector 114, which forms the first optical system 10, are arranged along a first axis A1. The second semiconductor laser 122, a collimation lens 123, the gas cell 2, and the second light detector 124, which forms the second optical system 20, are arranged along a second axis A2. The third semiconductor laser 132, a collimation lens 133, the gas cell 2, and the third light detector 134, which forms the third optical system 30, are arranged along a third axis A3.

The first axis A1 passes through the center of a first side surface 2a of the gas cell 2, the center of the gas cell 2 (center of cube), and the center of a second side surface 2b of the gas cell 2. The second axis A2 passes through the center of a third side surface 2c of the gas cell 2, the center of the gas cell 2, and the center of a fourth side surface 2d of the gas cell 2. The third axis A3 passes through the center of the lower surface 2e of the gas cell 2, the center of the gas cell 2, and the center of the upper surface 2f of the gas cell 2. The first axis A1, the second axis A2, and the third axis A3 intersect each other at the center of the gas cell 2 (center of cube) at right angles. The first axis A1, the second axis A2, and the third axis A3 coincide with the optical axis of the first resonance light L1, the optical axis of the second resonance light L2, and the optical axis of the third resonance light L3, respectively.

The gas cell 2 has a polyhedral shape. In the example shown in FIG. 5, the gas cell 2 has a box-like (cubic) shape. The gas cell 2 may alternatively have a hexagonal columnar shape, an octagonal columnar shape, or any other columnar shape, or a regular polyhedral shape. The gas cell 2 has the first side surface 2a, the second side surface 2b facing the first side surface 2a, the third side surface 2c connecting the first side surface 2a and the second side surface 2b to each other, the fourth side surface 2d facing the third side surface 2c, the lower surface 2e, and the upper surface 2f facing the lower surface 2e. In the gas cell 2, the distance between the first side surface 2a and the second side surface 2b, the distance between the third side surface 2c and the fourth side surface 2d, and the distance between the lower surface 2e and the upper surface 2f are equal to each other.

The first semiconductor laser 112 operates in such a way that the first resonance light L1 emitted therefrom, for example, passes through the center of the gas cell 2 (center of cube). The first semiconductor laser 112 further operates in such a way that the first resonance light L1 is incident on the first side surface 2a at right angles. The first resonance light L1 emitted from the first semiconductor laser 112 is incident on the first side surface 2a at right angles, passes through the center of the gas cell 2, and exits through the second side surface 2b. The first light detector 114 detects the first resonance light L1 having exited through the second side surface 2b.

The second semiconductor laser 122 operates in such a way that the second resonance light L2 emitted therefrom, for example, passes through the center of the gas cell 2. The second semiconductor laser 122 further operates in such a way that the second resonance light L2 is incident on the third side surface 2c at right angles. The second resonance light L2 emitted from the second semiconductor laser 122 is incident on the third side surface 2c at right angles, passes through the center of the gas cell 2, and exits through the fourth side surface 2d. The second light detector 124 detects the second resonance light L2 having exited through the fourth side surface 2d.

The third semiconductor laser 132 operates in such a way that the third resonance light L3 emitted therefrom, for example, passes through the center of the gas cell 2. The third semiconductor laser 132 further operates in such a way that the third resonance light L3 is incident on the lower surface 2e at right angles. The third resonance light L3 emitted from the third semiconductor laser 132 is incident on the lower surface 2e at right angles, passes through the center of the gas cell 2, and exits through the upper surface 2f. The third light detector 134 detects the third resonance light L3 having exited through the upper surface 2f.

The first optical system 10 may include the collimation lens 113, which converts the first resonance light L1 into parallelized light, between the first semiconductor laser 112 and the gas cell 2. Further, the second optical system 20 may include the collimation lens 123, which converts the second resonance light L2 into parallelized light, between the second semiconductor laser 122 and the gas cell 2. Further, the third optical system 30 may include the collimation lens 133, which converts the third resonance light L3 into parallelized light, between the third semiconductor laser 132 and the gas cell 2. The distances between the members in the second optical system 20 (second semiconductor laser 122, collimation lens 123, gas cell 2, and second light detector 124) are, for example, equal to the distances between the corresponding members in the first optical system 10 (first semiconductor laser 112, collimation lens 113, gas cell 2, and first light detector 114). Further, the distances between the members in the third optical system 30 (third semiconductor laser 132, collimation lens 133, gas cell 2, and third light detector 134) are, for example, equal to the distances between the corresponding members in the first optical system 10.

The semiconductor laser 112, 122, and 132, for example, have the same performance and can emit resonance light beams L1, L2, and L3 having the same beam diameter and beam intensity. Since the first resonance light L1, the second resonance light L2, and the third resonance light L3 are incident on the surfaces 2a, 2c, and 2e of the cubic gas cell 2 at right angles as described above, the optical path length of the first resonance light L1 in the gas cell 2, the optical path length of the second resonance light L2 in the gas cell 2, and the optical path length of the third resonance light L3 in the gas cell 2 are equal to each other. Further, the optical axis of the first resonance light L1, the optical axis of the second resonance light L2, and the optical axis of the third resonance light L3 intersect each other at the center of the gas cell 2 (center of cube) at right angles in the example shown in FIG. 5.

The optical module 1 and the atomic oscillator 100 according to the present embodiment have, for example, the following features.

According to the optical module 1, when the determination unit 40 determines that the first light source unit 12 has failed, the second light source unit 22 can irradiate the gas cell 2 with the resonance light L2. Since it is not necessary to exchange the entire optical module even when the first light source unit 12 fails, the exchange cost can be lowered as compared with a case where the entire optical module is exchanged. Further, according to the optical module 1, when the determination unit 40 determines that the second light source unit 22 has failed, the third light source unit 32 can irradiate the gas cell 2 with the resonance light L3. Since it is not necessary to exchange the entire optical module even when the second light source unit 22 fails, the exchange cost can be lowered as compared with the case where the entire optical module is exchanged.

Moreover, according to the optical module 1, the second optical system 20 and the third optical system 30 are so configured that the beam diameter, the optical path length, and other parameters of the resonance light beams L2 and L3 can be adjusted in advance. When the first optical system 10 is switched to the second optical system 20, the second optical system 20 can therefore provide the same oscillation characteristics as those provided by the first optical system 10. Similarly, when the second optical system 20 is switched to the third optical system 30, the third optical system 30 can provide the same oscillation characteristics as those provided by the first optical system 10 and the second optical system 20. As a result, a system that is instantly recoverable and maintains constant oscillation characteristics, for example, even when the first light source unit 12 and the second light source unit 22 fail can be formed.

Further, according to the optical module 1, since the switching between the optical systems is electrically done, the axes of the optical systems are unlikely to shift as compared, for example, with a case where an optical system is mechanically switched to another.

The optical module 1 operates under the following conditions: The gas cell 2 has a polyhedral shape; the first light source unit 12 emits the first resonance light L1, which is incident on the first side surface 2a; the first light detection unit 14 detects the first resonance light L1 having exited through the second side surface 2b; the second light source unit 22 emits the second resonance light L2, which is incident on the third side surface 2c; and the second light detection unit 24 detects the second resonance light L2 having exited through the fourth side surface 2c, whereby the optical path length of the first resonance light L1 in the gas cell 2 and the optical path length of the second resonance light L2 in the gas cell 2 can be readily set at the same value. The two optical systems and 20 capable of providing the same oscillation characteristics can therefore readily work with the single gas cell 2. Further, according to the optical module 1, the third light source unit 32 emits the third resonance light L3, which is incident on the lower surface 2e, and the third light detection unit 34 detects the third resonance light L3 having exited through the upper surface 2f. The three optical systems 10, 20, and 30 capable of providing the same oscillation characteristics can therefore readily work with the single gas cell 2.

According to the optical module 1, the first light source unit 12 emits the first resonance light L1, which is incident on the first side surface 2a at right angles, and the second light source unit 22 emits the second resonance light L2, which is incident on the third side surface 2c at right angles. Under the conditions described above, when an antireflection film (not shown) is, for example, provided on each of the first side surface 2a and the third side surface 2c of the gas cell 2, the antireflection film can be readily designed. When resonance light is, for example, obliquely incident on a surface of the gas cell, the antireflection film is difficult to design.

The optical module 1 operates under the following conditions: The gas cell 2 has a box-like shape; the first light source unit 12 emits the first resonance light L1, which passes through the center of the gas cell 2; the second light source unit 22 emits the second resonance light L2, which passes through the center of the gas cell 2; and the third light source unit 32 emits the third resonance light L3, which passes through the center of the gas cell 2. The above configuration can lower the degree of an adverse effect produced when the metal atoms impinge on the wall surfaces of the gas cell. When the metal atoms in the gas cell impinge on the wall surfaces of the gas cell, the atom density in the vicinity of the wall surfaces of the gas cell differs from the atom density at the center of the gas cell. As a result, the absorption characteristic, for example, differs between a case where resonance light does not pass through the center of the gas cell but passes through the vicinity of any of the wall surfaces of the gas cell and a case where the resonance light passes through the center of the gas cell. According to the present embodiment, since the resonance light beams L1, L2, and L3 pass through the center of the gas cell 2, the degree of the adverse effect described above can be lowered as compared with a case where the resonance light beams do not pass through the center of the gas cell. In the optical module 1, the determination unit 40 determines whether or not the light source unit 12 or 22 has failed based on the intensity of the resonance light L1 or L2 detected by the light detection unit 14 or 24. The above configuration allows information necessary to determine whether or not any of the light source units has failed to be obtained with no additional new member, whereby whether or not any of the light source units has failed can be readily determined.

Since the atomic oscillator 100 includes the optical module 1 described above, the exchange cost can be lowered. Further, the reliability of the atomic oscillator 100 can be improved.

2. Second Embodiment

Figure 6:
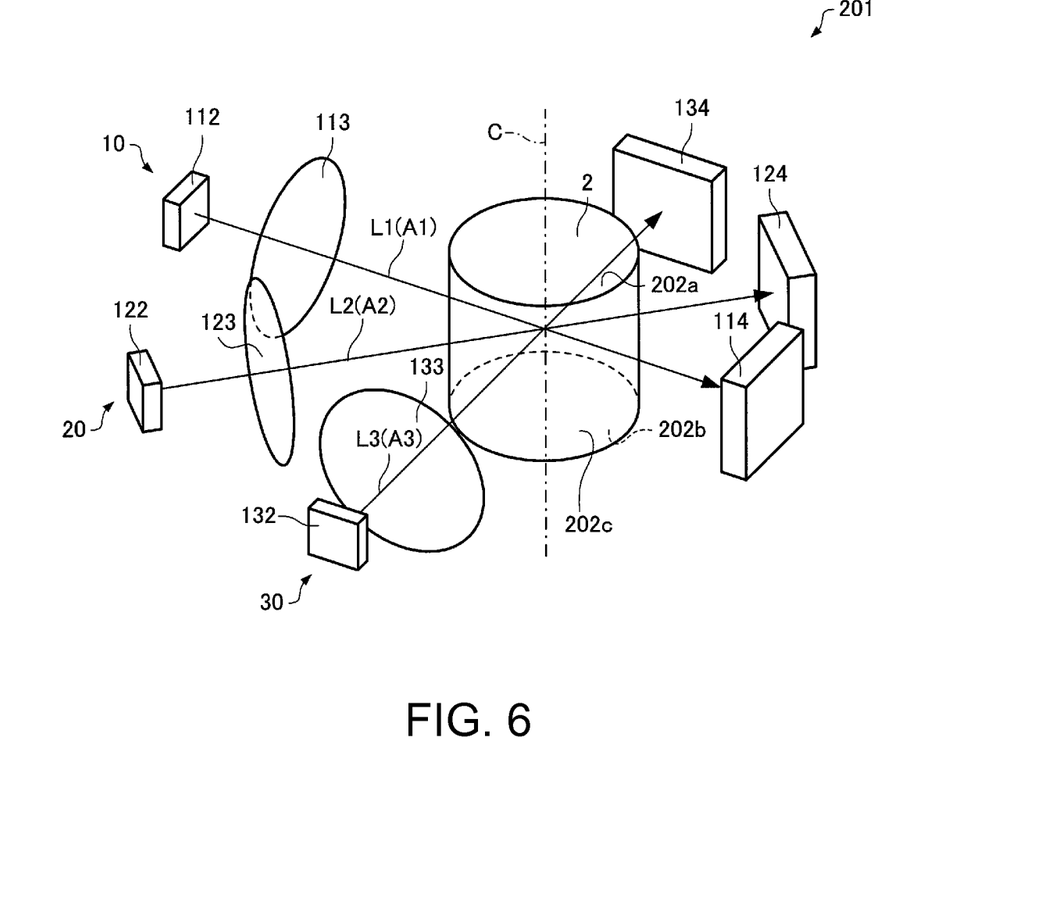
FIG. 6 is a perspective view diagrammatically showing an optical module for an atomic oscillator according to a second embodiment.

Anatomic oscillator according to a second embodiment will next be described with reference to the drawings. FIG. 6 is a perspective view diagrammatically showing an optical module 201 for an atomic oscillator according to the second embodiment. In the following description, members of the optical module 201 according to the second embodiment that have the same functions as those of the components of the optical module 1 according to the first embodiment have the same reference characters, and no description thereof will be made in detail. In the optical module 1 shown in FIG. 5 described above, the gas cell 2 has a polyhedral (cubic) shape. In contrast, in the optical module 201 according to the present embodiment, the gas cell 2 has a cylindrical shape, as shown in FIG. 6. The gas cell 2 has an upper surface 202a, a lower surface 202b, and a side surface 202c, as shown in FIG. 6.

A first axis A1 along which the first optical system 10 is disposed, a second axis A2 along which the second optical system 20 is disposed, and a third axis A3 along which the third optical system 30 is disposed are perpendicular to a central axis C of the gas cell 2 (central axis of cylinder). In the example shown in FIG. 6, the first axis A1, the second axis A2, and the third axis A3 intersect each other at the center of the gas cell 2 (center of cylinder). The angle between the first axis A1 and the second axis A2 is, for example, 60°. Further, the angle between the second axis A2 and the third axis A3 is, for example, 60°.

The first semiconductor laser 112 emits first resonance light L1 that travels in a direction, for example, perpendicular to the central axis C of the gas cell 2. The first semiconductor laser 112 directs the first resonance light L1 to the side surface 202c of the gas cell 2. The first resonance light L1 emitted from the first semiconductor laser 112 is incident on the side surface 202c, intersects the central axis C of the gas cell 2 at right angles, and exits through the side surface 202c in a position facing the position where the first resonance light L1 has entered. The first light detector 114 detects the first resonance light L1 having exited through the side surface 202c.

The second semiconductor laser 122 emits second resonance light L2 that travels in a direction, for example, perpendicular to the central axis C of the gas cell 2. The second semiconductor laser 122 directs the second resonance light L2 to the side surface 202c of the gas cell 2. The second resonance light L2 emitted from the second semiconductor laser 122 is incident on the side surface 202c, intersects the central axis C of the gas cell 2 at the right angles, and exits through the side surface 202c in a position facing the position where the second resonance light L2 has entered. The second light detector 124 detects the second resonance light L2 having exited through the side surface 202c.

The third semiconductor laser 132 emits third resonance light L3 that travels in a direction, for example, perpendicular to the central axis C of the gas cell 2. The third semiconductor laser 132 directs the third resonance light L3 to the side surface 202c of the gas cell 2. The third resonance light L3 emitted from the third semiconductor laser 132 is incident on the side surface 202c, intersects the central axis C of the gas cell 2 at right angles, and exits through the side surface 202c in a position facing the position where the third resonance light L3 has entered. The third light detector 134 detects the third resonance light L3 having exited through the side surface 202c.

Since the first resonance light L1, the second resonance light L2, and the third resonance light L3 intersect the central axis C of the gas cell 2 at right angles as described above, the optical path length of the first resonance light L1 in the gas cell 2, the optical path length of the second resonance light L2 in the gas cell 2, and the optical path length of the third resonance light L3 in the gas cell 2 are equal to each other. The other components of the atomic oscillator according to the present embodiment are the same as those of the atomic oscillator 100 described above, and no description thereof will be made.

The optical module 201 according to the present embodiment has, for example, the following features.

According to the optical module 201, the gas cell 2 has a cylindrical shape. As a result, for example, the degree of freedom in arranging the optical systems 10, 20, and 30 is higher than that in the case where the gas cell has a box-like shape.

The optical module 201 operates under the following conditions: The gas cell 2 has a cylindrical shape; the first semiconductor laser 112 emits the first resonance light L1 and allows it to be incident on the side surface 202c of the gas cell 2; and the second semiconductor laser 122 emits the second resonance light L2 and allows it to be incident on the side surface 202c of the gas cell 2. The optical path length of the first resonance light L1 in the gas cell 2 and the optical path length of the second resonance light L2 in the gas cell 2 can therefore be readily set at the same value. The two optical systems 10 and 20 capable of providing the same oscillation characteristics can therefore readily work with the single gas cell 2. Similarly, according to the optical module 201, the third semiconductor laser 132 emits the third resonance light L3 and allows it to be incident on the side surface 202c of the gas cell 2. The three optical systems 10, 20, and 30 capable of providing the same oscillation characteristics can therefore readily work with the single gas cell 2.

According to the optical module 201, the semiconductor lasers 112, 122, and 132 emit the resonance light beams L1, L2, and L3 in such a way that they intersect the central axis of the gas cell 2 (central axis C of cylinder) at right angles. The above configuration lowers the degree of the adverse effect produced when the metal atoms impinge on the wall surfaces of the gas cell.

The description has been made with reference to the case where the gas cell 2 has a cylindrical shape having circular upper and lower surfaces 202a, 202b. Although not shown, the gas cell 2 may alternatively have an elliptical columnar shape having elliptical upper and lower surfaces 202a, 202b. The above description has been made of the case where the optical module 201 includes the three optical systems 10, 20, and 30. Although not shown, the optical module may alternatively include four or more optical systems.

3. Third Embodiment

Figure 7:
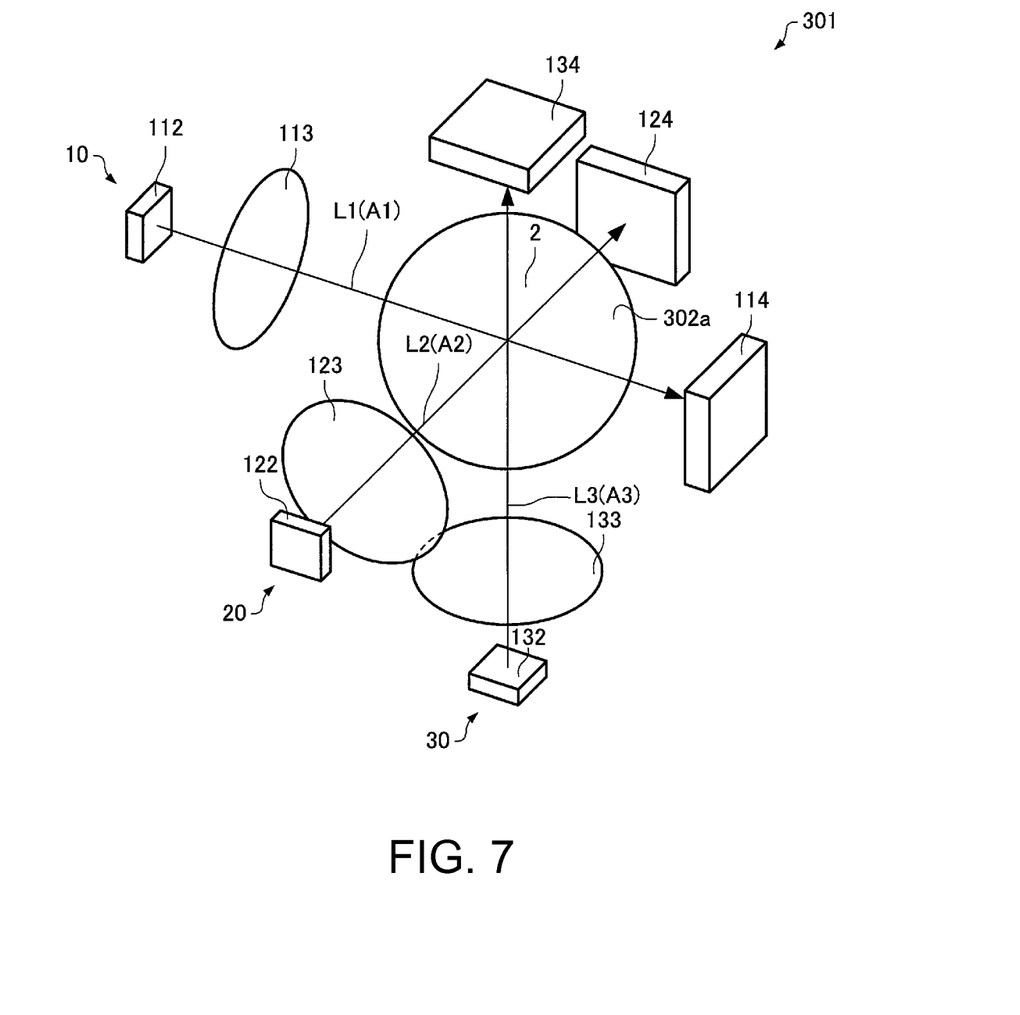
FIG. 7 is a perspective view diagrammatically showing an optical module for an atomic oscillator according to a third embodiment.

An atomic oscillator according to a third embodiment will next be described with reference to the drawings. FIG. 7 is a perspective view diagrammatically showing an optical module 301 for an atomic oscillator according to the third embodiment. In the following description, members of the optical module 301 according to the third embodiment that have the same functions as those of the components of the optical module 1 according to the first embodiment have the same reference characters, and no description thereof will be made in detail. In the optical module 1 shown in FIG. 5 described above, the gas cell 2 has a polyhedral (cubic) shape. In contrast, in the optical module 301 according to the present embodiment, the gas cell 2 has a spherical shape, as shown in FIG. 7. The gas cell 2 has a spherical surface 302a, as shown in FIG. 7.

A first axis A1 along which the first optical system 10 is disposed, a second axis A2 along which the second optical system 20 is disposed, and a third axis A3 along which the third optical system 30 is disposed pass through the center of the gas cell 2 (center of sphere). In the example shown in FIG. 7, the first axis A1, the second axis A2, and the third axis A3 intersect each other at the center of the gas cell 2 at right angles. The first semiconductor laser 112 emits first resonance light L1 that, for example, passes through the center of the gas cell 2 (center of sphere). The first semiconductor laser 112 directs the first resonance light L1 to the spherical surface 302a of the gas cell 2. The first resonance light L1 emitted from the first semiconductor laser 112 is incident on the spherical surface 302a, passes through the center of the gas cell 2 (center of sphere), and exits through the spherical surface 302a in a position facing the position where the first resonance light L1 has entered. The first light detector 114 detects the first resonance light L1 having exited through the spherical surface 302a.

The second semiconductor laser 122 emits second resonance light L2 that, for example, passes through the center of the gas cell 2. The second semiconductor laser 122 directs the second resonance light L2 to the spherical surface 302a of the gas cell 2. The second resonance light L2 emitted from the second semiconductor laser 122 is incident on the spherical surface 302a, passes through the center of the gas cell 2, and exits through the spherical surface 302a in a position facing the position where the second resonance light L2 has entered. The second light detector 124 detects the second resonance light L2 having exited through the spherical surface 302a.

The third semiconductor laser 132 emits third resonance light L3 that, for example, passes through the center of the gas cell 2. The third semiconductor laser 132 directs the third resonance light L3 to the spherical surface 302a of the gas cell 2. The third resonance light L3 emitted from the third semiconductor laser 132 is incident on the spherical surface 302a, passes through the center of the gas cell 2, and exits through the spherical surface 302a in a position facing the position where the third resonance light L3 has entered. The third light detector 134 detects the third resonance light L3 having exited through the spherical surface 302a.

Since the first resonance light L1, the second resonance light L2, and the third resonance light L3 pass through the center of the gas cell 2 as described above, the optical path length of the first resonance light L1 in the gas cell 2, the optical path length of the second resonance light L2 in the gas cell 2, and the optical path length of the third resonance light L3 in the gas cell 2 are equal to each other.

The other components of the atomic oscillator according to the present embodiment are the same as those of the atomic oscillator 100 described above, and no description thereof will be made.

The optical module 301 according to the present embodiment has, for example, the following features.

According to the optical module 301, the gas cell 2 has a spherical shape. As a result, for example, the degree of freedom in arranging the optical systems 10, 20, and 30 is higher than that in the case where the gas cell has a box-like shape.

According to the optical module 301, the gas cell 2 has a spherical shape, and the semiconductor lasers 112, 122, and 132 emit resonance light beams L1, L2, and L3 that pass through the center of the gas cell 2. The above configuration lowers the degree of the adverse effect produced when the metal atoms impinge on the wall surfaces of the gas cell.

The above description has been made of the case where the optical module 301 includes the three optical systems 10, 20, and 30. Although not shown, the optical module may alternatively include four or more optical systems.

The scope of the invention encompasses substantially the same configurations as the configurations described in the above embodiments (for example, a configuration having the same function, using the same method, and providing the same result or a configuration having the same purpose and providing the same effect). Further, the scope of the invention encompasses a configuration in which an inessential portion of the configuration described in the above embodiments is replaced. Moreover, the scope of the invention encompasses a configuration that provides the same advantageous effect as that provided in the configurations described in the above embodiments or a configuration that can achieve the same purpose as that achieved by the configurations described in the above embodiments. Further, the scope of the invention encompasses a configuration in which a known technology is added to the configuration described in any of the above embodiments.

The entire disclosure of Japanese Patent Application No. 2012-003274, filed Jan. 11, 2012 is expressly incorporated by reference herein.

What is claimed is:

1. An optical module for an atomic oscillator using a quantum interference effect, the optical module comprising:
    a first light source unit that emits first resonance light having two wavelengths different from each other, the first resonance ht having a first optical axis;
    a single gas cell in which an alkali metal atom is sealed;
    a first light detection unit that detects the intensity of the first resonance light having passed through the single gas cell;
    a determination unit that determines whether or not the first light source unit maintains a predetermined abnormal light output level;
    a second light source unit that irradiates the single gas cell with second resonance light having two wavelengths different from each other when the determination unit determines that the first light source unit maintains the predetermined abnormal light output level, the second resonance light having a second optical axis; and
    a second light detection unit that detects the intensity of the second resonance light having passed through the single gas cell, wherein
    the first optical axis and the second optical axis intersect each other at the single gas cell, and
    a first optical path length of the first resonance light in the single gas cell and a second optical path length of the second resonance light in the single gas cell are equal to each other.

2. The optical module for an atomic oscillator according to claim 1,
    wherein the single gas cell has a polyhedral shape having an even number of surfaces but at least six surfaces.

3. The optical module for an atomic oscillator according to claim 1,
wherein the single gas cell has
a first surface,
a second surface facing the first surface,
a third surface, and
a fourth surface facing the third surface,
a first distance between the first surface and the second surface and a second distance between the third surface and the fourth surface are equal to each other,
the first resonance light is incident on the first surface,
the first light detection unit detects the first resonance light having exited through the second surface,
the second resonance light is incident on the third surface, and
the second light detection unit detects the second resonance light having exited through the fourth surface.

4. The optical module for an atomic oscillator according to claim 3,
wherein the first resonance light is incident on the first surface at right angles, and
the second resonance light is incident on the third surface at right angles.

5. The optical module for an atomic oscillator according to claim 1,
wherein the single gas cell has a box-like shape, and
the first resonance light and the second resonance light that are incident on the single gas cell pass through a center of the single gas cell.

6. The optical module for an atomic oscillator according to claim 1,
wherein the single gas cell has a cylindrical shape.

7. The optical module for an atomic oscillator according to claim 6,
wherein the first resonance light and the second resonance light are incident on a cylindrical surface of the single gas cell.

8. The optical module for an atomic oscillator according to claim 7,
wherein the first optical axis and the second optical axis intersect a central axis of the cylindrical shape of the single gas cell at right angles.

9. The optical module for an atomic oscillator according to claim 1,
wherein the single gas cell has a spherical shape.

10. The optical module for an atomic oscillator according to claim 9,
wherein the first resonance light and the second resonance light that are incident on the single gas cell pass through a center of the single gas cell.

11. The optical module for an atomic oscillator according to claim 1,
wherein the determination unit determines whether or not the first light source unit maintains the predetermined abnormal light output level based on the intensity of the first resonance light detected by the first light detection unit.

12. An atomic oscillator comprising the optical module for an atomic oscillator according to claim 1.

13. An atomic oscillator comprising the optical module for an atomic oscillator according to claim 3.

14. An atomic oscillator comprising the optical module for an atomic oscillator according to claim 4.

15. An atomic oscillator comprising the optical module for an atomic oscillator according to claim 5.

16. An atomic oscillator comprising the optical module for an atomic oscillator according to claim 6.

17. An atomic oscillator comprising the optical module for an atomic oscillator according to claim 7.

18. An atomic oscillator comprising the optical module for an atomic oscillator according to claim 8.

19. An atomic oscillator comprising the optical module for an atomic oscillator according to claim 9.

20. An atomic oscillator comprising the optical module for an atomic oscillator according to claim 11.

* * * * *